United States Patent
He et al.

[11] Patent Number: 6,094,087
[45] Date of Patent: Jul. 25, 2000

[54] GATE DRIVE CIRCUIT FOR ISOLATED GATE DEVICES AND METHOD OF OPERATION THEREOF

[75] Inventors: Jin He, Plano; Mark E. Jacobs, Dallas; Kamakshi Sridhar, Plano, all of Tex.

[73] Assignee: Lucent Technologies Inc., Murray Hill, N.J.

[21] Appl. No.: 09/335,319

[22] Filed: Jun. 17, 1999

Related U.S. Application Data

[63] Continuation of application No. 08/903,408, Jul. 30, 1997.

[51] Int. Cl.[7] .................................... H03K 17/687
[52] U.S. Cl. .................... 327/434; 327/427; 327/376; 327/377; 327/379; 327/502
[58] Field of Search ................... 327/108, 109, 327/110, 427, 432, 433, 434, 478, 482, 374, 376, 377, 379, 382, 314, 325, 326, 502; 361/56, 91

[56] References Cited

U.S. PATENT DOCUMENTS

| | | | |
|---|---|---|---|
| 4,580,063 | 4/1986 | Torelli et al. | 327/546 |
| 5,352,932 | 10/1994 | Tihanyi | 327/109 |
| 5,723,916 | 3/1998 | Disney et al. | 307/131 |
| 5,808,504 | 9/1998 | Chikau et al. | 327/434 |
| 5,828,261 | 10/1998 | Antone et al. | 327/387 |
| 5,910,746 | 7/1999 | Fordyce | 327/379 |

OTHER PUBLICATIONS

Reference from IGBTMOD and Intellimod™—Intelligent Power Modules Applications and Technical Data Book by Powerex; Oct. 1994; 9 pages including cover sheets and pages A–49–A55.
Reference from IGBT Data Book "Fuji Hybrid IGBT Driver" Oct. 1992; cover sheet and pp. 303–312.
Reference from International Rectifier's HEXFET Power MOSFET Designer's Manual vol. III; "Gate Drive Characteristics and Requirements for Power HEXFETS"; Sep. 1993; cover sheets and pp. 1541–1548.

*Primary Examiner*—Timothy P. Callahan
*Assistant Examiner*—Hai L. Nguyen

[57] ABSTRACT

A gate drive circuit for an isolated gate device, a method of driving the same and a switch-mode power supply employing the circuit or the method. In one embodiment, the circuit includes: (1) a capacitor, having a first terminal coupled to a source of drive voltage and a second terminal coupled to a gate of the isolated gate device, that stores a charge therein when the drive voltage maintains the isolated gate device in an "on" state and (2) a conductive path, leading from the first terminal to an output terminal of the isolated gate device and enabled when the isolated gate device is to be transitioned from the "on" state to an "off" state, that provides a negative off-bias voltage to the gate thereby to avoid spurious turn-on of the isolated gate device.

22 Claims, 3 Drawing Sheets

GATE DRIVE CIRCUIT FOR ISOLATED GATE DEVICES AND METHOD OF OPERATION THEREOF

This is a continuation of U.S. patent application Ser. No. 08/903,408, filed on Jul. 30, 1997, entitled "GATE DRIVE CIRCUIT FOR ISOLATED GATE DEVICES AND METHOD OF OPERATION THEREOF" to He, et al., which is herein incorporated by reference.

TECHNICAL FIELD OF THE INVENTION

The present invention is directed, in general, to high power, isolated gate electronic devices and, more specifically, to a gate drive circuit for an isolated gate device and a method of operating such electronic devices.

BACKGROUND OF THE INVENTION

Isolated gate devices, such as metal oxide semiconductor field-effect transistors (MOSFETs), insulated gate bipolar transistors (IGBTs), and metal oxide semiconductor (MOS)-controlled thyristors (MCTs), are commonly found in many diverse electronic applications. One application of isolated gate devices, is in electronic power conversion circuits, such as those found in telecommunications power systems, motor controllers and uninterruptable power supplies (UPS).

Fast switching speed, ease of drive, wide safe operating area (SOA), peak current capability, avalanche and high dv/dt capability have made power MOSFETs a logical choice in modern power conversion circuits. IGBTs, on the other hand, being minority carrier MOS gate devices, have excellent conduction characteristics, while sharing many of the appealing features of power MOSFETs, such as ease of drive, wide SOA, peak current capability and ruggedness. Both IGBTs and MOSFETs, therefore, are widely used in electronic power conversion circuits.

The development of high-efficiency power converters with higher power density is a continuing goal in the field of power electronics. To reduce energy storage component size and to increase power density, switching frequencies of the isolated gate devices in the power conversion circuits are pushed higher and higher. One advantage of the high switching frequency is a reduction in switching power loss due to a reduction in a voltage-current crossover time. The rate of change of a drain-source voltage and a drain current of a MOSFET device (or similarly, the rate of change of a collector-emitter voltage and a collector current of an IGBT device), and thereby the switching frequency, is dependent on a gate current, which limits a charge and discharge rate of device capacitances. In high frequency applications, the gate current of the device may be substantial, thereby significantly increasing switching time.

It has been determined that the application of a negative bias voltage during a turn-off transition (negative off-bias voltage) significantly reduces the switching time and improves the immunity to spurious gate voltages of the switch. A conventional low side gate drive circuit, having a dedicated power supply, is typically used to provide the negative off-bias voltage to the switch. The gate drive circuit further includes a totem pole driver consisting of an npn transistor serially-coupled to a pnp transistor. The gate drive circuit further includes a resistor-zener structure coupled across the totem pole driver and powered by the dedicated power supply. The resistor-zener structure consists of a current-limiting resistor coupled in series with a zener diode. An energy storage capacitor is typically coupled across the zener diode to provide for local energy storage. The gate drive circuit still further includes a gate damping resistor coupled between the totem pole driver and a gate of an isolated gate device.

The gate drive circuit operates as follows. The npn transistor is turned on to apply a positive voltage to the gate of the isolated gate device often through the gate damping resistor, thereby turning on the isolated gate device. To turn off the isolated gate device, the npn transistor is turned off and the pnp transistor is turned on. The negative off-bias voltage stored in the energy storage capacitor by the zener diode is thus applied to the gate of the isolated gate device, quickly discharging a gate capacitance of the isolated gate device. While the above approach fulfills its intended purpose, a dedicated power supply is required, which not only increases system cost, but also consumes valuable space on the printed wiring board.

Accordingly, what is needed in the art is a gate drive circuit that provides its own negative off-bias voltage, removing the need for a dedicated power supply to provide the negative off-bias voltage.

SUMMARY OF THE INVENTION

To address the above-discussed deficiencies of the prior art, the present invention provides a gate drive circuit for an isolated gate device, a method of driving the same and a switch-mode power supply employing the circuit or the method. In one embodiment, the circuit includes: (1) a capacitor, having a first terminal coupled to a source of drive voltage and a second terminal coupled to a gate of the isolated gate device, that stores a charge therein when the drive voltage maintains the isolated gate device in an "on" state and (2) a conductive path, leading from the first terminal to an output terminal of the isolated gate device and enabled when the isolated gate device is to be transitioned from the "on" state to an "off" state, that provides a negative off-bias voltage to the gate thereby to avoid spurious turn-on of the isolated gate device.

The present invention therefore eliminates the need for a dedicated power supply by storing and discharging the drive voltage itself to provide the negative off-bias voltage. The term "isolated gate device" refers to a class of devices that includes, but is not limited to, FETS, IGBTs and MCTs. The term "output terminal" refers to a source terminal of a MOSFET device, and, analogously, to an emitter terminal of an IGBT device. Of course, the present invention is equally applicable to devices that turn-on with a negative voltage and, correspondingly, require a positive off-bias voltage to be maintained in a non-conducting state. In such instances, the polarities of the devices illustrated in the illustrated embodiments would be reversed.

In one embodiment of the present invention, the circuit further includes a totem-pole driver, coupled between the source of drive voltage and the first terminal, that switches to: (1) maintain the isolated gate device in the "on" state and (2) enable the conductive path when the isolated gate device is to be transitioned from the "on" state to the "off" state. In an embodiment to be illustrated and described, the totem-pole driver consists of serially-coupled npn and pnp transistors.

In one embodiment of the present invention, the circuit further includes a drainage resistor, coupling the gate and the output terminal, that provides a discharge path for currents stored in the gate. Those skilled in the art are familiar with such conventional drainage resistors, although the use of such in conjunction with the gate drive of the present invention is novel.

In one embodiment of the present invention, the circuit further includes a first zener diode and a second diode serially coupled in opposition between the second terminal and the output terminal, the first zener diode limiting a positive value of the drive voltage, the second diode preventing the first zener diode from conducting when the isolated gate device is in the "off" state. In a more specific embodiment, the second diode is a zener diode. In a related embodiment, the circuit further includes a current-limiting resistor, coupled between the source of drive voltage and the first terminal, that limits a current passing through the first zener diode.

In one embodiment of the present invention, the circuit further includes a gate damping resistor, coupled between the second terminal and the gate, that reduces a voltage ringing in the gate. Those skilled in the art are familiar with such conventional gate damping resistors, although the use of such in conjunction with the gate drive of the present invention is novel.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
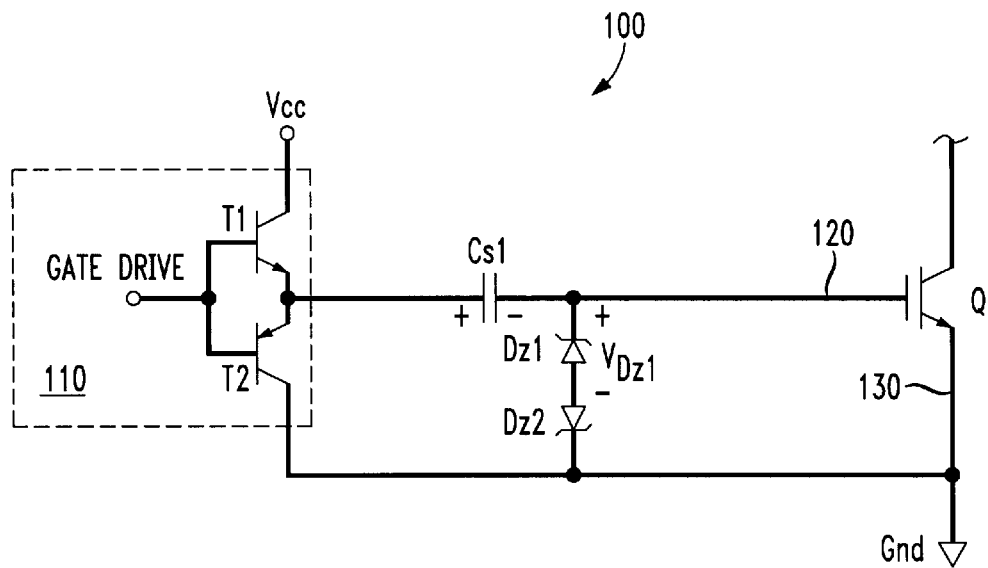
FIG. 1 illustrates an embodiment of a gate drive circuit for an isolated gate device constructed according to the principles of the present invention.

Referring initially to FIG. 1, illustrated is an embodiment of a gate drive circuit 100 for an isolated gate device Q constructed according to the principles of the present invention. In this embodiment, the isolated gate device Q is an IGBT. Those skilled in the art should understand, however, that the gate drive circuit 100 may also be used to drive other isolated gate devices, such as FETs (including MOSFETs) and MCTs. Of course, one gate drive circuit 100 may drive one or multiple isolated gate devices Q.

The gate drive circuit 100 includes a capacitor Cs1, having a positive terminal and a negative terminal. The positive terminal is coupled, via a totem-pole driver 110, to a source of drive voltage Vcc. The negative terminal is coupled to a gate 120 of the isolated gate device Q. In the illustrated embodiment, the totem-pole driver 110 consists of an npn transistor T1 serially-coupled to a pnp transistor T2. Those skilled in the art should realize, however, that the use of any driver circuit or device is well within the broad scope of the present invention.

The gate drive circuit 100 further includes a conductive path leading from the positive terminal of the capacitor Cs1 to an output terminal 130 of the isolated gate device Q. The conductive path is enabled when the isolated gate device Q is to be transitioned from the "on" state to an "off" state.

The gate drive circuit 100 still further includes a first zener diode Dz1, having a first diode voltage VDz1, and a second diode Dz2. The first zener diode Dz1 and second diode Dz2 are serially coupled in opposition between the negative terminal and the output terminal 130. In the illustrated embodiment, the second diode Dz2 is a zener diode. Of course, in other embodiments, the second diode Dz2 may not be a zener diode.

The gate drive circuit 100 operates as follows. The npn transistor T1 is turned on to apply the drive voltage Vcc to the positive terminal. The drive voltage Vcc charges the capacitor Cs1 and drives the gate 120 to turn on the isolated gate device Q. As the isolated gate device Q is maintained in an on state, the capacitor Cs1 stores the charge provided by the drive voltage Vcc.

The first zener diode Dz1 and second diode Dz2 clamp the voltage across the capacitor Cs1. In the illustrated embodiment, the capacitor Cs1 is chosen to be larger (e.g., ten times larger) than a gate input capacitance of the isolated gate device Q. The capacitor Cs1 is thus charged up to a capacitor voltage VCs1, wherein VCs1=Vcc−(VDz1+0.7V).

To initiate a transition from the on state to an off state, the npn transistor T1 is turned off and the pnp transistor T2 is turned on. Turning off the npn transistor T1 removes the drive voltage Vcc from the gate 120, thereby turning off the isolated gate device Q. Simultaneously, the pnp transistor T2 is turned on to provide a conductive path leading from the positive terminal of the capacitor Cs1 to the output terminal 130 of the isolated gate device Q. With the positive terminal at a ground potential, the stored charge across the capacitor Cs1 forces the negative terminal to a negative off-bias voltage. The negative off-bias voltage is applied to the gate of the isolated gate device Q, quickly discharging a gate capacitance thereof. The isolated gate device Q may thus be turned off with the negative off-bias voltage, thereby avoiding a spurious turn-on of the isolated gate device Q and reducing switching power losses associated with the isolated gate device Q.

Figure 2:
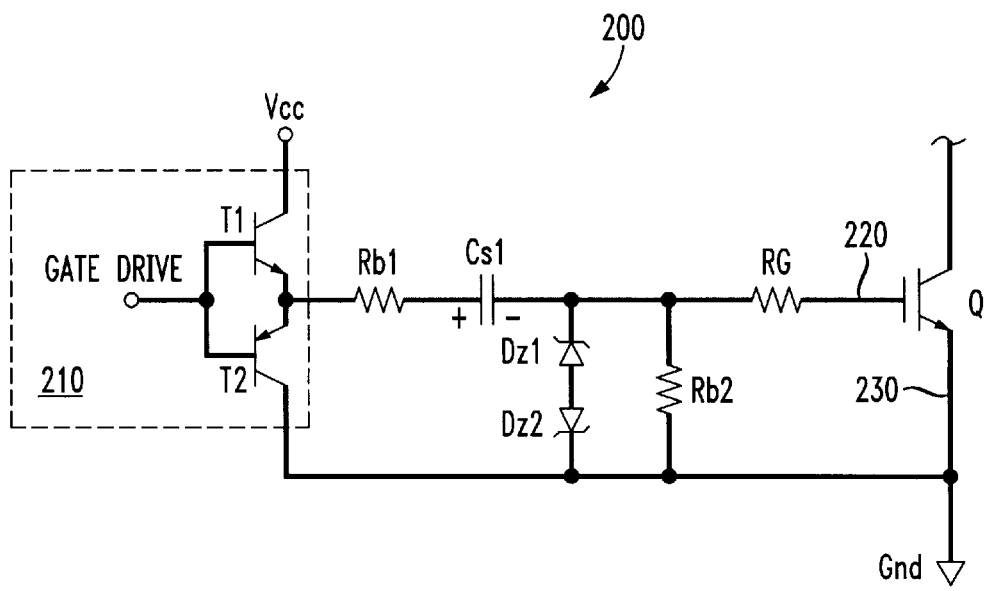
FIG. 2 illustrates another embodiment of a gate drive circuit for an isolated gate device constructed according to the principles of the present invention.

Turning now to FIG. 2, illustrated is another embodiment of a gate drive circuit 200 for an isolated gate device Q constructed according to the principles of the present invention. Although the illustrated gate drive circuit 200 drives an IGBT, those skilled in the art should realize that the gate drive circuit 200 may be used to drive any of a class of devices that includes, but is not limited to, FETs, IGBTs and MCTs. Further, one gate drive circuit 200 may drive one or multiple isolated gate devices (for instance, multiple parallel isolated gate devices).

The gate drive circuit 200 includes a capacitor Cs1 having a positive terminal and a negative terminal. The gate drive circuit 200 further includes a totem pole driver 210 consisting of an npn transistor T1 serially-coupled to a pnp transistor T2. The positive terminal of the capacitor Cs1 is coupled, via a current-limiting resistor Rb1 and the npn transistor T1, to a source of drive voltage Vcc. The negative terminal of the capacitor Cs1 is coupled, via a gate damping resistor RG, to a gate 220 of the isolated gate device Q.

The gate drive circuit 200 further includes a conductive path, leading from the positive terminal to an output terminal 230 of the isolated gate device Q. In the illustrated embodiment, the conductive path is composed of the current-limiting resistor Rb1 and the pnp transistor T2. The conductive path is enabled when the isolated gate device Q is to be transitioned from the "on" state to an "off" state.

The gate drive circuit 200 further includes a drainage resistor Rb2, coupling the gate 220 (via the gate damping resistor RG) and the output terminal 230, that provides a discharge path for currents stored in the gate 220. The gate drive circuit 200 further includes a first zener diode Dz1 and a second diode Dz2 serially coupled in opposition between the second terminal and the output terminal 230. In the illustrated embodiment, the second diode Dz2 is a zener diode. Those skilled in the art should realize that the present invention does not require the use of a zener diode for the second diode Dz2.

The function of the gate drive circuit 200 is analogous to that of the gate drive circuit 100 of FIG. 1. The npn transistor T1 switches on, coupling the drive voltage Vcc, through the current limiting resistor Rb1, to the positive terminal. The drive voltage Vcc charges the capacitor Cs1 and drives the gate 220 via the gate damping resistor RG to turn on the isolated gate device Q. As the isolated gate device Q is maintained in an on state by the totem-pole driver 210, the capacitor Cs1 stores the charge provided by the drive voltage Vcc. The current limiting resistor Rb1 limits a current through the first zener diode Dz1. The first zener diode Dz1, in turn, limits a positive value of the drive voltage Vcc, thereby regulating the voltage charged across the capacitor Cs1.

During the "on" state, the capacitor Cs1 is charged up to a capacitor voltage VCs1, wherein VCs1=Vcc−(VDz1+ 0.7volts), since the capacitor Cs1 is selected to be larger than a gate input capacitance of the isolated gate device Q.

When the isolated gate device Q is to be transitioned from the "on" state to the "off" state, the npn transistor T1 switches off, and the pnp transistor T2 switches on to enable the conductive path. With the positive terminal at a ground potential, the stored charge across the capacitor Cs1 places the negative terminal at a negative bias voltage. In this embodiment, a negative value of the negative off-bias voltage is limited by the second diode Dz2. The conductive path provides the negative off-bias voltage, via the gate damping resistor RG, to the gate of the isolated gate device Q. The gate damping resistor RG reduces a voltage ringing in the gate 220, while the negative off-bias voltage quickly discharges gate capacitances allowing the isolated gate device Q to be turned off. Spurious turn-on of the isolated gate device Q may thereby be avoided. The gate drive circuit 200 therefore eliminates the need for a dedicated power supply by storing the negative off-bias voltage in the capacitor Cs1.

Figure 3:
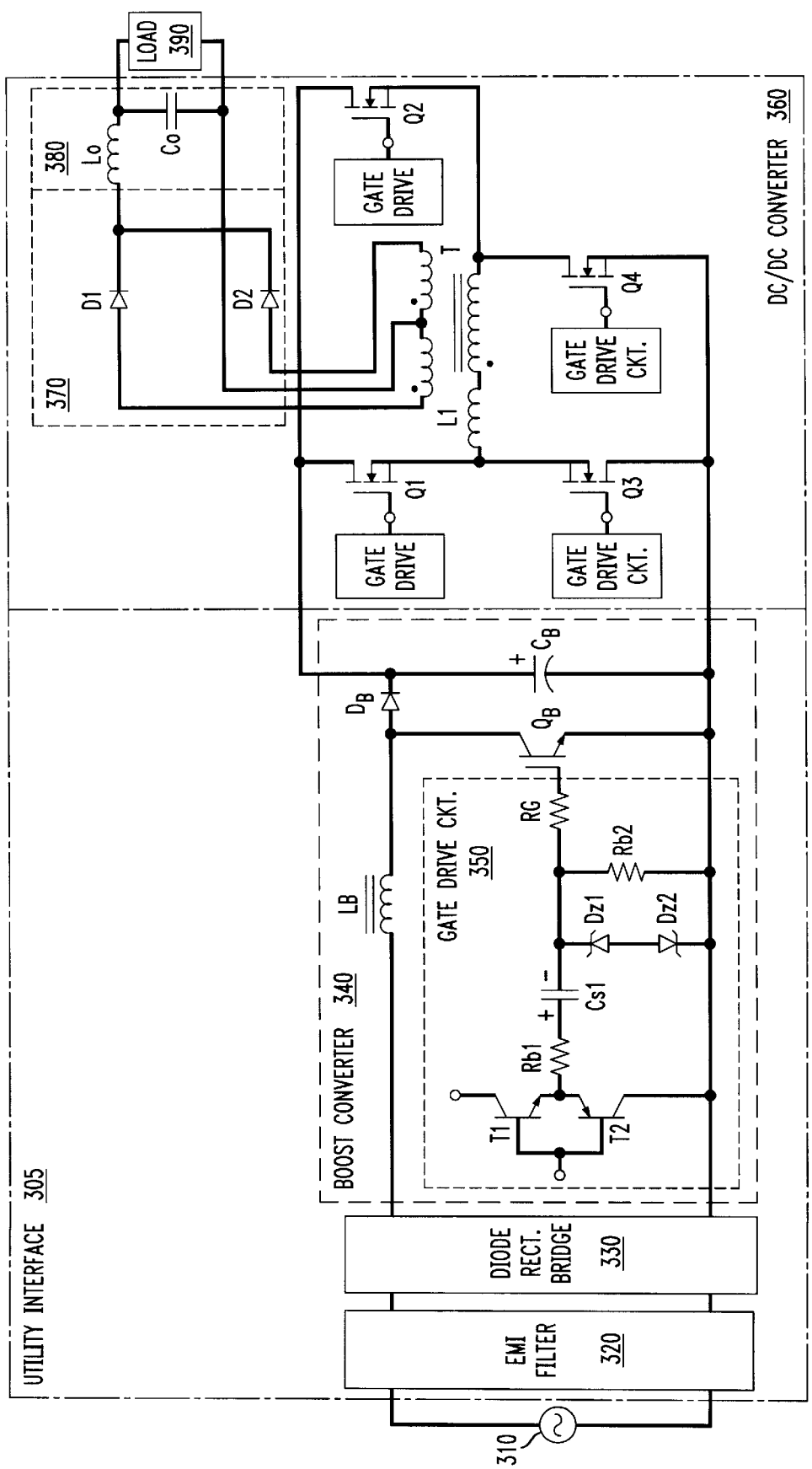
FIG. 3 illustrates an embodiment of a switch mode rectifier constructed according to the principles of the present invention.

Turning now to FIG. 3, illustrated is an embodiment of a switch-mode rectifier 300 constructed according to the principles of the present invention. The switch-mode rectifier 300 includes a utility interface or power train 305, coupled to a source of alternating current (AC) power 310, that converts the AC power into direct current (DC) power. The utility interface 305, in the illustrated embodiment, includes an electromagnetic interference (EMI) filter 320, coupled to the source of AC power 310, to ensure compliance with EMI standards. The utility interface 305 further includes a diode rectifier bridge 330 coupling the EMI filter 320 to a boost converter 340. The boost converter 340, in this embodiment, includes a boost inductor LB, a boost diode DE, a boost switch QB and a boost capacitor CB. The operation of the utility interface 305 to convert AC power to DC power is well known in the art and therefore will not be described.

The switch-mode rectifier 300 further includes a DC/DC converter 360 coupling the utility interface 305 to a load 390.

The DC/DC converter 360 scales a DC voltage from the utility interface 305 to a specified DC voltage required by the load 390.

In the illustrated embodiment, the DC/DC converter 360 includes a power switching stage (consisting of switches Q1, Q2, Q3, Q4) that receives the DC power from the utility interface 305 and produces therefrom switched electrical power. The DC/DC converter 360 further includes a power transformer T and an inductor L1 coupled to power switching stage. The DC/DC converter 360 further includes a rectifier 370 (consisting of rectifying diodes D1, D2), coupled to the power transformer T. The DC/DC converter 360 still further includes a filter stage 380 that includes an output inductor Lo and an output capacitor Co for filtering the switched electrical power to produce output electrical power. The filter stage 380 is coupled between the rectifier 380 and the load 390.

The switch-mode rectifier 300 still further includes a number of gate drive circuits (one of which is designated 350). The gate drive circuit 350 is analogous to the gate drive circuit 200 of FIG. 2 and, therefore, will not herein be described. In the illustrated embodiment of the present invention, the gate drive circuit 350, may be used to drive the boost switch QB in the boost converter 340, or the switches (for instance, switches Q3, Q4) of the power switching stage. Although the boost switch QB and the switches Q1, Q2, Q3, Q4 are illustrated as an IGBT and MOSFETs respectively, the gate drive circuit 350 may be used to drive any isolated gate device. Those skilled in the art should be familiar with conventional switch-mode rectifiers and an operation thereof, although the use of the gate drive circuit 350 in conjunction with the switches is novel. The use of the gate drive circuit 350 in the switch-mode rectifier therefore eliminates the need for a dedicated power supply for supplying the negative off-bias voltage.

Figure 4:
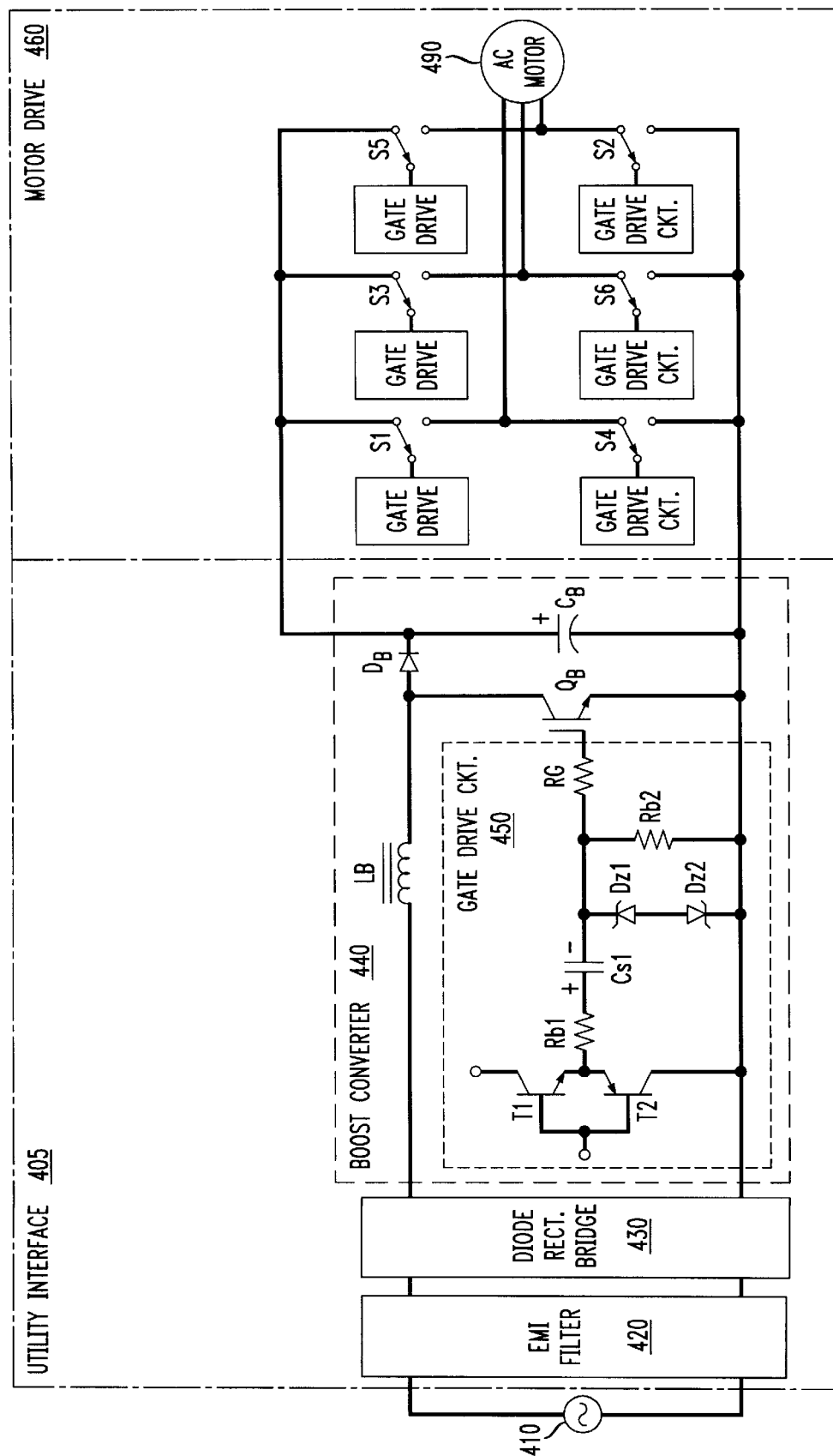
FIG. 4 illustrates an embodiment of a power factor corrected AC motor drive system constructed according to the principles of the present invention.

Turning now to FIG. 4, illustrated is an embodiment of a power factor corrected AC motor drive system 400 constructed according to the principles of the present invention. The system 400 includes a utility interface 405, analogous to the utility interface 305 of FIG. 3, coupled to a source of alternating current (AC) power 410. The utility interface 405 includes an EMI filter 420, coupled to the source of AC power 410, to ensure compliance with EMI standards. The utility interface 405 further includes a diode rectifier bridge 430 coupling the EMI filter 420 to a boost converter 440 (consisting of a boost inductor LB, a boost diode DB, a boost switch QB, and a boost capacitor CB). The operation of the utility interface 405 to convert AC power to DC power is well known in the art and therefore will not be described.

The system 400 further includes a motor drive 460 coupled between the utility interface and an AC motor 490. The motor drive 460, in this embodiment of the present invention, consists of six switches S1, S2, S3, S4, S5, S6 that provides switched power to an AC motor 490, thereby controlling a rate of rotation of the motor 490. The illustrated embodiment presents the switches S1, S2, S3, S4, S5, S6 in generic form. Those skilled in the art should realize, however, that any of a class of devices that includes, but is not limited to, FETs, IGBTs and MCTs may be used.

The system 400 still further includes a number of gate drive circuits (one of which is designated 450). In the illustrated embodiment of the present invention, the gate drive circuit 450, may be used to drive the boost switch QB in the boost converter 340, or the switches (for instance, switches S2, S4, S6) of the motor drive 460. The gate drive circuit 350 is analogous to the gate drive circuit 200 of FIG. 2. Those skilled in the art should be familiar with conventional power factor corrected AC drive systems and an operation thereof, although the use of the gate drive circuit 350 in conjunction with the switches is novel. The gate drive circuits thus allow the switches in the system 400 to be turned off without requiring a dedicated power supply.

Those skilled in the art should understand that the previously described embodiment of the gate drive circuit (and applications employed therewith) is submitted for illustrative purposes only, and other embodiments capable of providing a negative off-bias voltage to an isolated gate device without the use of a dedicated power supply are well within the broad scope of the present invention. For a better understanding of power electronics, including switch-mode rectifiers, motor drive systems, utility interfaces and boost converters, see *Power Electronics: Converters, Applications and Design*, by N. Mohan, T. M. Undeland, and W. P. Robbins, John Wiley & Sons Publishing Company (1989) which is herein incorporated by reference.

Although the present invention has been described in detail, those skilled in the art should understand that they can make various changes, substitutions and alterations herein without departing from the spirit and scope of the invention in its broadest form.

What is claimed is:

1. A gate drive circuit for an isolated gate device, comprising:
    a capacitor, having a first terminal coupled to a source of drive voltage and a second terminal coupled to a gate of said isolated gate device, that stores a charge therein when said drive voltage maintains said isolated gate device in an "on" state;
    a conductive path, leading from said first terminal to a terminal of said isolated gate device and enabled when said isolated gate device is to be transitioned from said "on" state to an "off" state, that provides a path for a negative off-bias voltage from said capacitor to discharge a gate capacitance of said gate thereby to avoid spurious turn-on of said isolated gate device;
    a zener diode, coupled between said second terminal and said terminal of said isolated gate device, that limits a positive value of said drive voltage thereby regulating said negative off-bias voltage; and
    a blocking diode, serially-coupled in opposition to said zener diode, that prevents said zener diode from conducting when said isolated device is in said "off" state.

2. The circuit as recited in claim 1 further comprising a totem-pole driver, coupled between said source of drive voltage and said first terminal, that switches to:
    maintain said isolated gate device in said "on" state, and
    enable said conductive path when said isolated gate device is to be transitioned from said "on" state to said "off" state.

3. The circuit as recited in claim 1 further comprising a drainage resistor, coupling said gate and said terminal of said isolated gate device, that provides a discharge path for currents stored in said gate.

4. The circuit as recited in claim 1 wherein said blocking diode is a blocking zener diode.

5. The circuit as recited in claim 1 further comprising a current-limiting resistor, coupled between said source of drive voltage and said first terminal, that limits a current passing through said zener diode.

6. The circuit as recited in claim 1 further comprising a gate damping resistor, coupled between said second terminal and said gate, that reduces a voltage ringing in said gate.

7. The circuit as recited in claim 1 wherein said isolated gate device is selected from the group consisting of:
    a field-effect transistor (FET),
    an insulated gate bipolar transistor (IGBT), and
    a metal oxide semiconductor (MOS)-controlled thyristor (MCT).

8. A method of driving an isolated gate device, comprising:
    storing a charge in a capacitor, having a first terminal coupled to a source of drive voltage and a second terminal coupled to a gate of said isolated gate device, when said drive voltage maintains said isolated gate device in an "on" state;
    coupling said first terminal to a terminal of said isolated gate device when said isolated gate device is to be transitioned from said "on" state to an "off" state to provide a path for a negative off-bias voltage from said capacitor to discharge a gate capacitance of said gate and thereby avoid spurious turn-on of said isolated gate device;
    limiting a positive value of said drive voltage with a zener diode coupled between said second terminal and said terminal of said isolated gate device thereby regulating said negative off-bias voltage; and
    preventing said zener diode from conducting when said isolated gate device is in said "off" state with a blocking diode serially-coupled in opposition to said zener diode.

9. The method as recited in claim 8 further comprising switching a totem-pole driver, coupled between said source of drive voltage and said first terminal, to:
    maintain said isolated gate device in said "on" state, and
    enable said conductive path when said isolated gate device is to be transitioned from said "on" state to said "off" state.

10. The method as recited in claim 8 further comprising providing a discharge path for currents stored in said gate.

11. The method as recited in claim 8 wherein said blocking diode is a blocking zener diode.

12. The method as recited in claim 8 further comprising limiting a current passing through said zener diode.

13. The method as recited in claim 8 further comprising reducing a voltage ringing in said gate.

14. The method as recited in claim 8 wherein said isolated gate device is selected from the group consisting of:
    a field-effect transistor (FET),
    an insulated gate bipolar transistor (IGBT), and
    a metal oxide semiconductor (MOS)-controlled thyristor (MCT).

15. A switch-mode power supply, comprising:
    a power train, coupled to a source of AC power, that converts said AC power into DC power, said power train including a boost converter that corrects a power factor of said AC power; and
    a gate drive circuit for driving at least one isolated gate device in said switch-mode power supply, including:
        a capacitor, having a positive terminal coupled to a source of drive voltage and a negative terminal coupled to a gate of said isolated gate device, that stores a charge therein when said drive voltage maintains said isolated gate device in an "on" state, a conductive path, leading from said positive terminal to a terminal of said isolated gate device and enabled when said isolated gate device is to be transitioned from said "on" state to an "off" state, that provides a path for a negative off-bias voltage from said capacitor to discharge a gate capacitance of said gate thereby to avoid spurious turn-on of isolated gate device, a zener diode, coupled between said negative terminal and said terminal of said isolated gate device, that limits a positive value of said drive voltage thereby regulating said negative off-bias voltage, and a blocking diode, serially coupled in opposition with said zener diode, that prevents said zener diode from conducting when said isolated gate device is in said "off" state.

16. The switch-mode power supply as recited in claim 15 further comprising a totem-pole driver, coupled between said source of drive voltage and said positive terminal, that switches to:

maintain said isolated gate device in said "on" state, and enable said conductive path when said isolated gate device is to be transitioned from said "on" state to said "off" state.

17. The switch-mode power supply as recited in claim 15 further comprising a drainage resistor, coupling said gate and said terminal of said isolated gate device, that provides a discharge path for currents stored in said gate.

18. The switch-mode power supply as recited in claim 15 wherein said blocking diode is a blocking zener diode.

19. The switch-mode power supply as recited in claim 15 further comprising a current-limiting resistor, coupled between said source of drive voltage and said positive terminal, that limits a current passing through said zener diode.

20. The switch-mode power supply as recited in claim 15 further comprising a gate damping resistor, coupled between said negative terminal and said gate, that reduces a voltage ringing in said gate.

21. The switch-mode power supply as recited in claim 15 wherein said isolated gate device is selected from the group consisting of:

a field-effect transistor (FET), an insulated gate bipolar transistor (IGBT), and a metal oxide semiconductor (MOS)-controlled thyristor (MCT).

22. The switch-mode power supply as recited in claim 15 wherein said power supply can function alternatively as a switch-mode rectifier and a motor drive.

* * * * *